US009991678B1

(12) United States Patent
Thielen et al.

(10) Patent No.: US 9,991,678 B1
(45) Date of Patent: Jun. 5, 2018

(54) DISPERSION COMPENSATED DIFFRACTIVE OPTICAL ELEMENT BEAM COMBINER

(71) Applicant: NORTHROP GRUMMAN SYSTEMS CORPORATION, Falls Church, VA (US)

(72) Inventors: Peter A. Thielen, Long Beach, CA (US); William H. Long, Jr., Torrance, CA (US); Eric C. Cheung, Torrance, CA (US); Gregory D. Goodno, Los Angeles, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 315 days.

(21) Appl. No.: 14/734,959

(22) Filed: Jun. 9, 2015

Related U.S. Application Data

(60) Provisional application No. 62/031,001, filed on Jul. 30, 2014.

(51) Int. Cl.

| | |
|---|---|
| *H01S 5/00* | (2006.01) |
| *H01S 3/08* | (2006.01) |
| *H01S 5/40* | (2006.01) |
| *H01S 5/14* | (2006.01) |
| *H01S 3/082* | (2006.01) |
| *H01S 3/067* | (2006.01) |
| *H01S 3/10* | (2006.01) |
| *H01S 3/23* | (2006.01) |

(Continued)

(52) U.S. Cl.
CPC ........ *H01S 5/4012* (2013.01); *H01S 3/06754* (2013.01); *H01S 3/08009* (2013.01); *H01S 3/0812* (2013.01); *H01S 3/0826* (2013.01); *H01S 3/10007* (2013.01); *H01S 3/10023* (2013.01); *H01S 3/1055* (2013.01); *H01S 3/1305* (2013.01); *H01S 3/2308* (2013.01); *H01S 5/143* (2013.01)

(58) Field of Classification Search
CPC .... H01S 5/4012; H01S 3/1305; H01S 3/0812; H01S 3/0826; H01S 3/08009; H01S 3/06754; H01S 3/2308; H01S 3/10023; H01S 3/10007; H01S 5/143; H01S 3/1055
See application file for complete search history.

(56) References Cited

U.S. PATENT DOCUMENTS 6,496,622 B1    12/2002    Hoose et al.
6,765,730 B2    7/2004    Takahashi
(Continued)

OTHER PUBLICATIONS

Andrusyak, Oleksiy G. "Dense Spectral Beam Combining with Volume Bragg Gratings in Photo-Thermo-Refractive Glass" Dissertation, 2009, 151 pgs.

*Primary Examiner* — Yuanda Zhang
(74) *Attorney, Agent, or Firm* — John A. Miller; Shumaker, Loop & Kendrick, LLP

(57) ABSTRACT

An optical system, such as a fiber laser amplifier, including a plurality of optical sources, such as fiber amplifiers, each generating a beam. In one embodiment, the system includes first and second diffraction gratings that correct the angle of the propagation direction of the beams to remove angular dispersion caused by a diffractive optical element (DOE). In another embodiment, the system includes a single diffraction grating, where the optical beams pass through the grating twice to also remove the angular dispersion caused by the DOE.

20 Claims, 3 Drawing Sheets

(51) Int. Cl.
   *H01S 3/081*    (2006.01)
   *H01S 3/1055*   (2006.01)
   *H01S 3/13*     (2006.01)

(56) References Cited

U.S. PATENT DOCUMENTS

| | | |
|---|---|---|
| 6,795,601 B1 | 9/2004 | Mitchell et al. |
| 7,123,413 B2 | 10/2006 | Dickson et al. |
| 7,230,761 B2 | 6/2007 | Arns |
| 7,436,588 B2 | 10/2008 | Rothenberg et al. |
| 7,468,832 B2 | 12/2008 | Rothenberg et al. |
| 7,535,631 B2 | 5/2009 | Brown et al. |
| 7,664,348 B2 | 2/2010 | Ma |
| 7,903,326 B2 | 3/2011 | Gaudiosi et al. |
| 7,948,680 B2 | 5/2011 | Goodno |
| 8,068,522 B2 | 11/2011 | Barty |
| 8,526,110 B1 | 9/2013 | Honea et al. |
| 8,614,853 B2 | 12/2013 | Chann et al. |
| 8,630,039 B2 | 1/2014 | Shpunt |
| 8,630,323 B2 | 1/2014 | Honea et al. |
| 8,811,823 B2 | 8/2014 | Amitai |
| 8,830,566 B2 | 9/2014 | Rothenberg et al. |
| 2007/0127123 A1 | 6/2007 | Brown et al. |
| 2008/0084598 A1* | 4/2008 | Rothenberg ....... B23K 26/0604 359/238 |
| 2008/0084605 A1* | 4/2008 | Rothenberg ....... B23K 26/0604 359/337.21 |
| 2009/0273840 A1 | 11/2009 | McLaughlin |
| 2013/0201560 A1 | 8/2013 | Dueck |

\* cited by examiner

DISPERSION COMPENSATED DIFFRACTIVE OPTICAL ELEMENT BEAM COMBINER

CROSS-REFERENCE TO RELATED APPLICATIONS

This application claims the benefit of the filing date of Provisional Application Ser. No. 62/031,001 titled, Dispersion Compensated Diffractive Optical Element Beam Combiner, filed Jul. 30, 2014.

GOVERNMENT CONTRACT

This invention was made with Government support under Contract FA9451-13-D-0258 awarded by the United States Air Force. The Government has certain rights in this invention.

BACKGROUND OF THE INVENTION

Field

This invention relates generally to a high power fiber laser amplifier having a broadband output and, more particularly, to a high power fiber laser amplifier having a broadband output, where the amplifier employs one or more diffraction gratings to correct for the angular dispersion induced by a diffractive optical element (DOE) that provides coherent beam combination (CBC).

Discussion

High power laser amplifiers have many applications, including industrial, commercial, military, etc. Designers of laser amplifiers are continuously investigating ways to increase the power of the laser amplifier for these and other applications. One known type of laser amplifier is a fiber laser amplifier that employs a doped fiber that receives a seed beam and a pump beam to amplify the seed beam and generate the laser beam, where the fiber has an active core diameter of about 10-20 µm or larger.

Improvements in fiber laser amplifier designs have increased the output power of the fiber to approach its practical power and beam quality limit. To further increase the output power of a fiber amplifier some fiber laser systems employ multiple fiber laser amplifiers that combine the amplified beams in some fashion to generate higher powers. A design challenge for fiber laser amplifier systems of this type is to combine the beams from a plurality of fiber amplifiers in a manner so that the beams provide a single beam output having a uniform phase over the beam diameter such that the beam can be focused to a small focal spot. Focusing the combined beam to a small spot at a long distance (far-field) defines the quality of the beam.

In one known multiple fiber amplifier design, a master oscillator (MO) generates a seed beam that is split into a plurality of fiber seed beams each having a common wavelength, where each fiber beam is amplified. The amplified fiber seed beams are then collimated and directed to a diffractive optical element (DOE) that combines the coherent fiber beams into a single combined output beam. The DOE has a periodic structure formed into the element so that when the individual fiber beams each having a slightly different angular direction are redirected by the periodic structure all of the beams diffract from the DOE in the same direction. Each fiber beam is provided to a phase modulator that controls the phase of the beam so that the phase of all the fiber beams is maintained coherent. However, limitations on bandwidth and phasing errors limits the number of fiber beams that can be coherently combined, thus limiting the output power of the laser.

In another known multiple fiber amplifier design, a plurality of master oscillators (MOs) generate a plurality of fiber seed beams at a plurality of wavelengths, where each fiber beam is amplified. The amplified fiber seed beams are then collimated and directed to a diffraction grating, or other wavelength-selective element, that combines the different wavelength fiber beams into a single output beam. The diffraction grating has a periodic structure formed into the element so that when the individual fiber beams each having a slightly different wavelength and angular direction are redirected by the periodic structure all of the beams diffract from the diffraction grating in the same direction. However, limitations on bandwidth limit the number of fiber beams that can be wavelength-combined, thus limiting the output power of the laser.

To overcome these limitations and further increase the laser beam power, multiple master oscillators can be provided to generate seed beams at different wavelengths, where each of the individual wavelength seed beams is split into a number of fiber seed beams and where each group of fiber beams has the same wavelength and are mutually coherent. Each group of the coherent fiber seed beams at a respective wavelength are first coherently combined by a DOE, and then each group of coherently combined beams are directed to a spectral beam combining (SBC) grating at slightly different angles that diffracts the beams in the same direction as a single combined beam of multiple wavelengths. The SBC grating also includes a periodic structure for combining the beams at the different wavelengths.

It is often desirable that the output beam from a fiber laser amplifier be narrow linewidth, i.e., have a narrow frequency range, to improve beam quality. However, providing both high power and narrow linewidth has heretofore been challenging in the art because those requirements are typically incompatible with each other because higher power typically requires a wider beam linewidth. More particularly, the phenomenon of stimulated Brillouin scattering (SBS) i.e., back scattering of the beam as it propagates along the fiber amplifier, increases at narrower linewidths with small frequency ranges, which acts to reduce beam power. However, the wider the beam linewidth, the more difficult it is to coherently combine or spectrally combine beams from multiple fibers into a single beam through known beam combining techniques. Particularly, dispersion effects from an SBC grating require that the linewidth of the beams being amplified is narrow, where spectral dispersion causes the spectral components of the beam to be diffracted at different angles. In other words, for SBC, the spectral brightness of the seed beam directly limits the theoretical brightness of the combined beam output.

For coherent beam combining (CBC), the spectral brightness of the seed beam limits the beam combining efficiency as a result of imperfect matching of group delay and dispersion between amplifiers. Typically, the source spectral brightness is limited by SBS, and the seed beam source to the fiber amplifiers must be frequency-modulated to reduce the peak SBS gain and achieve the desired output power. The FM spectral broadening limits the attainable spectral brightness from a single fiber amplifier, thus limiting the system output.

Current high power fiber laser amplifiers typically operate with a center seed beam frequency of about 1 micron. In order to suppress SBS and other non-linearities in fiber amplifiers, the seed beam needs to be spectrally broadened.

Current state of the art amplifiers providing 1-3 kW power levels typically need to be seeded with tens of gigahertz of optical bandwidth to properly operate. Future high power amplifiers may even need to be seeded with hundreds of gigahertzs of optical bandwidth to suppress non-linearities. These broad bandwidths can impact combining efficiency when using a DOE as a result of the dispersive nature of the DOE, where the DOE imparts a different angular dispersion to each of the input beams resulting in non-ideal overlap in the far-field and reducing combining efficiency. In other words, those beams that impinge the DOE at higher orders and are diffracted into the common output beam from the DOE have a certain dispersion based on their order that causes the beam to expand in the common beam differently than the other input beams impinging the DOE.

The impact on combining efficiency becomes significant when the angular dispersion is greater than 10% of the natural diffraction of the input beams to the DOE. The impact on combining efficiency can be mitigated by either decreasing the angular dispersion or increasing the natural divergence by decreasing the spot size on the DOE. However, the former increases the size of the beam combiner and the latter increases the beam intensity on the DOE, neither of which is desirable in typical high power fiber amplifier systems.

DETAILED DESCRIPTION OF THE EMBODIMENTS

The following discussion of the embodiments of the invention directed to a technique for providing dispersion compensation of a DOE using one or more diffraction gratings in a fiber laser amplifier system is merely exemplary in nature, and is in no way intended to limit the invention or its applications or uses.

As will be discussed in detail below, the present invention proposes a technique for providing compensation for the angular dispersion caused by a DOE in a fiber laser amplifier system. By imposing an angular dispersion that is equal to but opposite of the dispersion that is caused by the DOE will result in the optical output beam having no dispersion. The dispersion imparted by the DOE is proportional to the order of the input beam so that the center input beam at zero order has no angular dispersion and the outer beams at higher orders have the highest angular dispersion. In one embodiment, the present invention employs a single diffraction grating that is passed through twice by the amplified optical beam to first compensate for the difference in angular dispersion between the input beams, but leaving a near identical, but non-zero dispersion in all of the beams. After being combined by the DOE, the combined beam impinges the grating again to remove the remaining angular dispersion. In another embodiment, the technique employs two separate gratings that provide the same operation. Because a grating and a DOE have different dispersions, two passes through the grating removes the dispersion of the first grating and then the dispersion of the DOE.

A DOE with multiple beams coming in at angles $\theta_m$ and a single combined beam going out at an angle $\theta$ satisfies:

$$\sin\theta_m + \sin\theta = \frac{m\lambda}{\Lambda}, \quad (1)$$

where $\Lambda$ is the periodicity of the DOE.

The angular dispersion of a DOE is the change in the angle $\theta$ as the wavelength $\lambda$ changes, with all of the incoming angles $\theta_m$ held fixed as:

$$\frac{\partial\theta}{\partial\lambda} = \frac{m}{\Lambda\cos\theta}, \quad (2)$$

$$\frac{\partial\theta}{\partial\nu} = -\frac{m\lambda^2}{c\Lambda\cos\theta}. \quad (3)$$

The dispersion from the DOE is zero for the m=0 beam, and for a total of 2M+1 beams, the dispersion of the outer most higher order beam is M/Λ. If all of the beams have the same wavelength $\lambda$, then the outgoing beam from the DOE will have all components propagating in phase at the same angle. In this case, the beam quality of the outgoing combined beam will be limited by the beam quality of the individual incoming beams. However, if the beams have inherent bandwidth or frequency chirp, then the outgoing beam will have an angular divergence or sweep, which degrades the beam quality or affects beam pointing.

Figure 1:
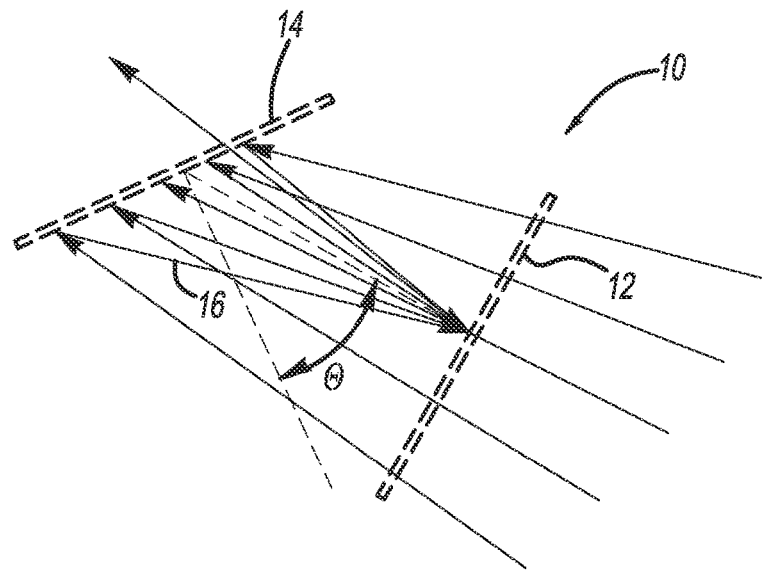
FIG. 1 is an illustration of an optical system including a grating and a DOE.

As mentioned above, a grating can be employed to precondition the beams coming into the DOE by adding dispersion on each beam to cancel the DOE dispersion. FIG. 1 is an illustration of an optical system 10 including a DOE 12 and a grating 14 for this purpose. Beams 16 coming into the DOE 12 are first reflected off of the grating 14 at angles $\theta_m+\Theta$, where:

$$\sin\theta_{m'} + \sin(\theta_m + \Theta) = \frac{\lambda}{d}. \quad (4)$$

The net angular dispersion is the change in the final angle $\theta$ as the wavelength $\lambda$ changes with all incoming angles $\theta_{m'}$ held fixed as:

$$\cos\theta\frac{\partial\theta}{\partial\lambda} = \frac{m}{\Lambda} - \frac{1}{d}\frac{\cos\theta_m}{\cos(\theta_m + \Theta)}. \quad (5)$$

By expanding the dispersion as a power series in the angle $\theta_m$, and assuming the angles $\theta_m$ and $\theta$ are small, then:

$$\theta_m + \theta \approx m\lambda/\Lambda, \quad (6)$$

and:

$$\cos\theta\frac{\partial\theta}{\partial\lambda} = \frac{m}{\Lambda} - \frac{1}{d}\left[\frac{1}{\cos\Theta} + \frac{\sin\Theta}{\cos^2\Theta}\theta_m + \frac{\sin^2\Theta}{\cos^3\Theta}\theta_m^2 + \ldots\right]. \quad (7)$$

If the grating line space d is selected as:

$$d \approx \frac{\sin\Theta}{\cos^2\Theta}\lambda, \quad (8)$$

then the derivative of the dispersion with respect to m is zero at m=0, but there is a large constant dispersion of −1/d cos θ, and for m=50, a maximum dispersion of −1(1+θ$_m^2$ tan$^2$θ)/d cos θ.

One grating can only compensate the slope of the dispersion at a single point in the array of the beams 16. If the angle θ is chosen to be 35.3° for the Littrow configuration, where the Littrow angle is sin θ$_L$=λ/2Λ, and d=0.921 μm for zero slope, then the residual dispersion at m=0 is 5.018 μr/GHz. For 101 beams in a maximum DOE angle of θ$_{50}$=0.1 r, the quadratic term gives a net dispersion of 5.018 +0.025 μr/GHz for the greatest dispersed beam.

In one embodiment, the beams are sent through a single grating twice for dispersion compensation once before the DOE and once after the DOE so that the large constant dispersion caused by the grating of the zero order beam is subtracted out by the second pass of the beam through the grating. The grating can be tilted to avoid beam overlap and is oriented near the Littrow configuration to minimize beam ellipticity.

Figure 2:
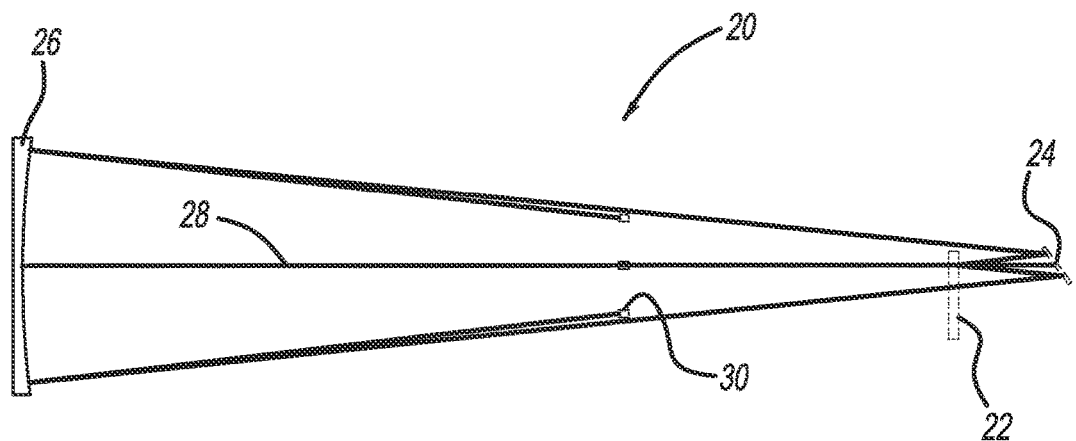
FIG. 2 is an illustration of an optical system showing dispersion compensation of a DOE with a single grating.

FIG. 2 is an illustration of an optical system 20 showing this embodiment that includes a DOE 22, a diffraction grating 24 and a mirror 26. A series of beams 28, for example, 100 beams, are emitted from separate optical sources 30. The center source 30 provides the beam 28 that hits the DOE 22 at the zero order and the bottom and top sources 30 provide the beams 28 that are at the extreme ends of the fiber array and have the largest DOE impingement angle, in this example, the 50th order. The beams 28 emitted from the sources 30 are directed towards the mirror 26 and are reflected therefrom towards the grating 24, where the mirror 26 collimates the beams 28 from the sources 30 to direct the beams to the grating 24 at the desired angle. The beams 28 hit the grating 24 at slightly different angles and are diffracted by the grating 24 so that the beams 28 overlap and impinge the DOE 22 at the desired input angle. The beams 28 are then reflected from the DOE 22 back to the grating 24 as a combined beam at a different angle than they originally impinged the grating 24 to remove the overall dispersion created by the first reflection of the beam off of the grating 22. The combined beam is then reflected from the grating 24 a second time in a direction towards the DOE 22, but out of plane into or out of the paper so that they do not impinge the DOE 22, where the combined beam is the output beam without dispersion. Although the illustration of the optical system 20 in this embodiment shows all reflective optical elements, specifically the mirror 26, the grating 24 and the DOE 22, in other embodiments, the same optical affect will occur using any combination of reflective or transmissive mirrors, lenses, gratings and DOEs, with appropriate folding optics.

Figure 3:
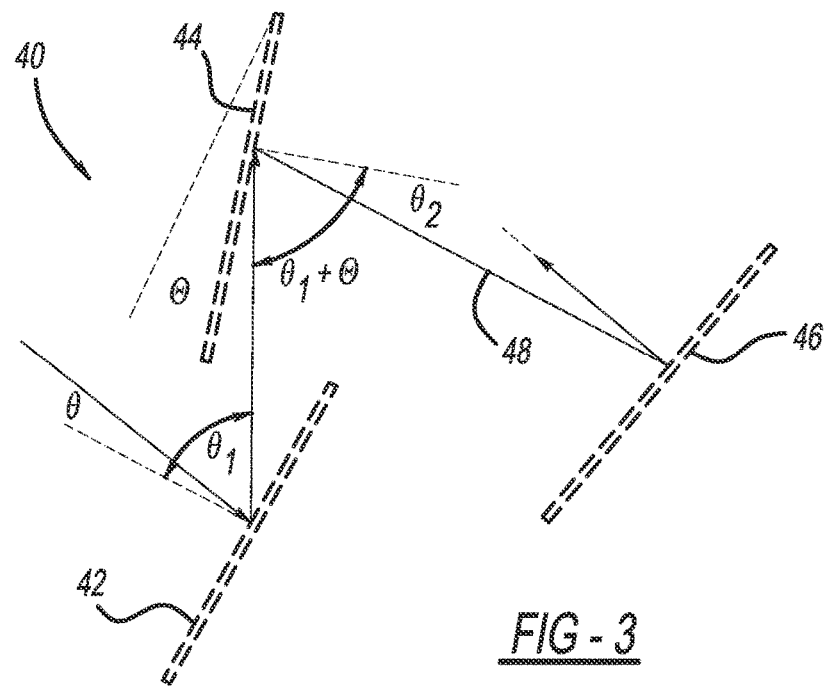
FIG. 3 is an illustration of an optical system showing dispersion compensation of a DOE with two gratings.

The discussion above employs a single diffraction grating where the beams pass twice through the grating to provide the dispersion compensation. In an alternate embodiment, two separate gratings can be employed in an optical system to provide the same effect. FIG. 3 is an illustration of an optical system 40 including a first diffraction grating 42, a second diffraction grating 44, a DOE 46 and a beam 48 being reflected threrefrom showing this embodiment. The following equations show the reflective grating relationship and the angular dispersion due to bandwidth for this design. The incident angle θ, grating line spacing d$_1$ for the grating 42 and d$_2$ for the grating 44, and the angle θ between the grating 42 and the grating 44 are chosen so that the angular dispersion of the output beam cancels that of a given diffractive optical element.

$$\sin\theta_1 + \sin\theta_0 = \frac{\lambda}{d_1}, \quad (9)$$

$$\sin\theta_2 + \sin(\theta_1 + \Theta) = \frac{\lambda}{d_2}, \quad (10)$$

$$\frac{\partial\theta_2}{\partial v} = \frac{\lambda^2/c}{\cos\theta_2}\left\{\frac{1}{d_1}\frac{\cos(\theta_1+\Theta)}{\cos\theta_1} - \frac{1}{d_2}\right\}, \quad (11)$$

$$\theta_1 = \sin^{-1}\left[-\sin\theta_0 + \frac{\lambda}{d_1}\right], \quad (12)$$

$$\theta_2 = \sin^{-1}\left[-\sin(\theta_1+\Theta) + \frac{\lambda}{d_2}\right]. \quad (13)$$

Figure 4:
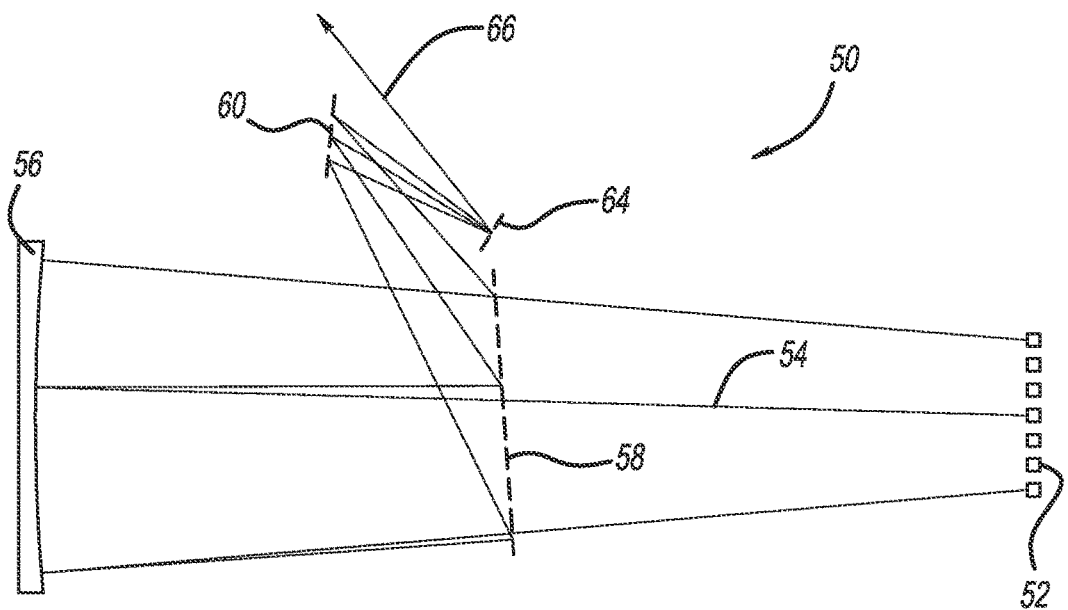
FIG. 4 is an illustration of an optical system showing dispersion compensation of a DOE with two gratings.

FIG. 4 is a plan view of an optical system 50 showing dispersion compensation as discussed above using two gratings. The system 50 includes a number of optical sources 52 representing the output of fiber amplifiers that emit optical beams 54. The beams 54 are reflected off of a mirror 56 and directed towards a first diffraction grating 58, where the path of the beams 54 between the optical sources 52 and the mirror 56 is out of plane with the grating 58. The beams 54 reflected from the mirror 56 are diffracted by the diffraction grating 58 and directed towards a second diffraction grating 60 at a predetermined angle. The diffraction grating 60 diffracts the beams 54 towards a DOE 64 at different angles to become combined into a single output beam 66, where the focal length of the mirror 56, and the fiber angle and separation of the beams 54 define the beam size and angular spread of the beam 66 at the DOE 64.

Figure 5:
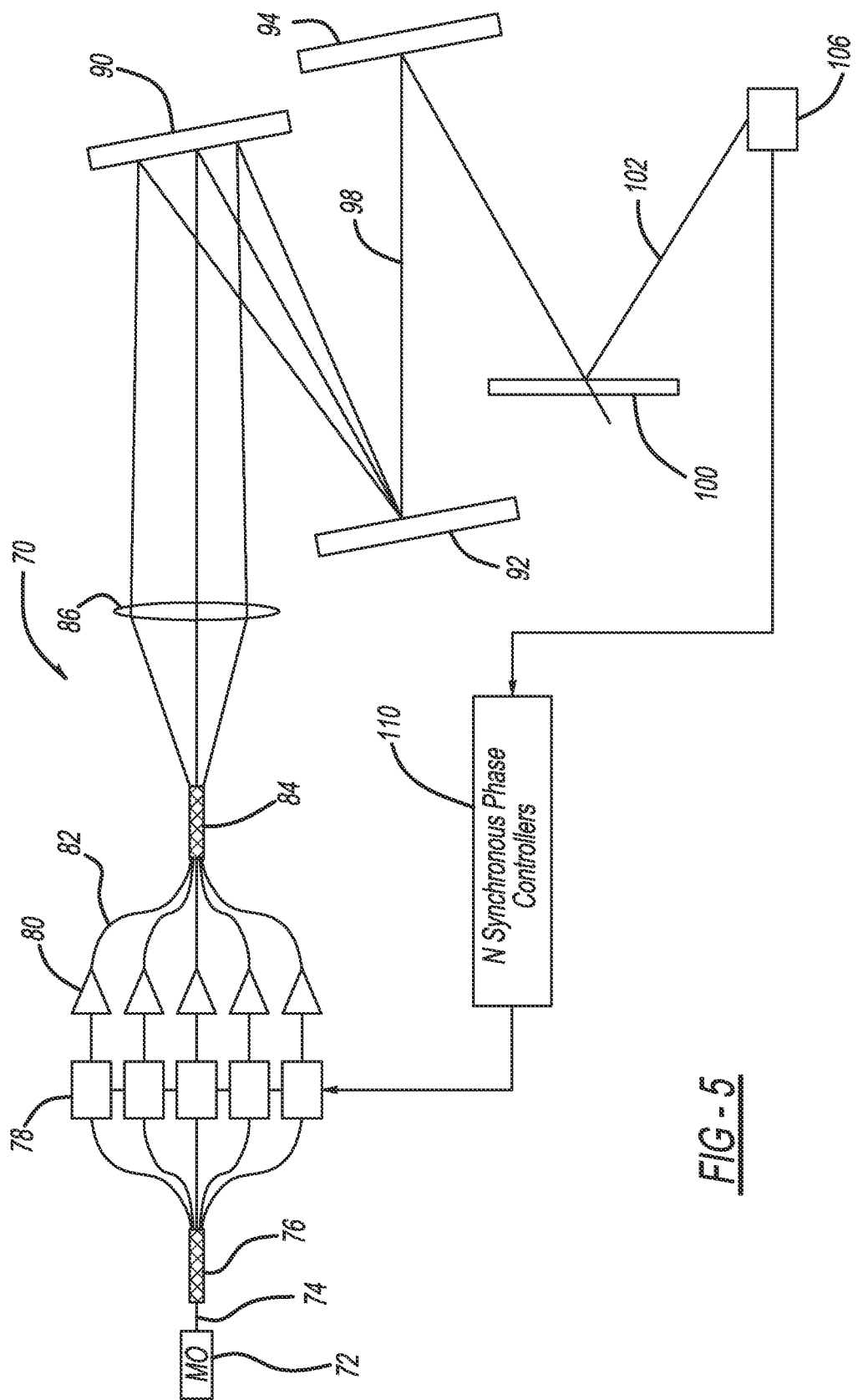
FIG. 5 is a schematic plan view of a fiber laser amplifier system.

FIG. 5 is a schematic diagram of a fiber laser amplifier system 70 showing one possible implementation of diffraction grating dispersion compensation using two diffraction gratings as discussed above. The system 70 includes a master oscillator (MO) 72 that generates a seed beam having an appropriate and desirable linewidth λ on an optical fiber 74, where the seed beam is split by a splitter 76 into N, here five, split fiber seed beams. Each split beam is provided to a phase modulator 78 that corrects the phase of each split seed beam so that all of the beams are coherent and in phase with each other as will be discussed below. The phase modulated split fiber seed beams from the phase modulators 78 are each sent to a fiber amplifier 80, where the amplifiers 80 are a length of a doped amplifying portion of a fiber 82 that receives an optical pump beam (not shown). Typically, multiple consecutive fiber amplifiers for each split seed beam would be provided for the desired amplification. The fibers 82 are combined into a fiber array 84 and the amplified fiber beams are directed to collimating optics 86 that collimates the beams, where the beams have a slightly different angle of propagation as a result of their position in the array 84.

The collimated and amplified fiber beams are directed to a first diffraction grating 90 that provides dispersion compensation in the manner discussed above. The diffracted fiber beams from the grating 90 are then directed to a DOE 92 that is positioned in the back focal plane of the collimating optics 86 to ensure an optimal beam overlap of all of the beams on the DOE 92 at the same location. The DOE 92 corrects the angular orientation of the amplified fiber beams, combines the beams into a combined beam 98, and directs the combined beam 98 to a second diffraction grating 94 to remove the overall dispersion of the DOE 92 as discussed above, where the combined beam 98 is the output beam of the system 70. The combined beam 98 is directed to sampling optics 100 that removes a small sample beam 102 that is used for phase modulation purposes. The sample beam 102 from the sampling optics 100 is directed to a phase detector 106, such as a photodetector, that measures the phase of each beam constituent in the combined beam 98 and provides an electrical measurement signal to a N synchronous phase processor 110 that controls the modulators 78 in a manner well understood by those skilled in the art.

The phase of the constituent fiber beams in the combined beam 98 can be distinguished in a single output from the phase detector 106 by uniquely dithering or coding the constituent fiber beams in phase or amplitude, such as by using distinct frequencies for frequency modulation (FM) or amplitude modulation (AM), distinct codes for code division multiple access (CDMA) or time division multiple access (TDMA), etc., so that a synchronous detector scheme can distinguish the constituent phase signals for each fiber beam in the combined beam. Such a technique is disclosed, for example, in U.S. Pat. No. 7,346,085 issued Mar. 18, 2008 to Rothenberg et al., titled Multi-Stage Method and System for Coherent diffractive Beam Combining, assigned to the assignee of this application and herein incorporated by reference. The synchronous phase processor 110 decodes the distinct constituent phases in the measurement signal from the phase detector 106, and generates phase error correction signals for each fiber beam that are sent to the corresponding phase modulator 78 so that adjustments to the phase of the individual fiber beams in the fiber amplifiers 80 causes all of the constituent fiber beams to be locked in phase.

The embodiment discussed above includes positioning the DOE 92 between the diffraction gratings 90 and 94. In an alternate embodiment, the optical order of the DOE 92 and the second diffraction grating 94 can be reversed where the fiber beams are first diffracted by the first diffraction grating 90, and then diffracted by the second diffraction grating 94 before be sent to the DOE 92 in the manner discussed above for the optical system 50. Also, as discussed above, those skilled in the art will readily understand how suitable optical elements, such as folding optics, transmissive optics, etc., can be employed so that the system 70 can provide dispersion compensation of the DOE 92 using a single diffraction grating, where the beams are reflected off of or transmitted through the diffraction grating two times in the manner discussed above.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. An optical system comprising:
   a plurality of optical sources each generating a beam where all of the beams are coherent;
   a first diffraction grating receiving and diffracting the coherent beams, wherein the coherent and diffracted beams from the first diffraction grating propagate in different angular directions;
   a diffractive optical element (DOE) receiving the diffracted beams from the first diffraction grating and combining the diffracted beams into a combined beam, wherein the DOE combines the diffracted beams into the combined beam so that the beams propagate in substantially a same direction, but where the beams have an angular dispersion caused by the DOE depending on where the beams impact the DOE; and
   a second diffraction grating receiving the combined beam from the DOE and redirecting the combined beam, wherein the first and second diffraction gratings remove the angular dispersion of the combined beam caused by the DOE.

2. The optical system according to claim 1 wherein the system is a fiber amplifier system.

3. The optical system according to claim 2 wherein the plurality of optical sources are fiber amplifiers.

4. The optical system according to claim 2 wherein the plurality of optical sources include at least one seed beam source providing an optical seed beam and a beam splitter splitting the seed beam into a plurality of split seed beams.

5. The optical system according to claim 4 wherein the plurality of optical sources include a plurality of phase modulators each receiving one of the split seed beams and phase modulating the split seed beam and a plurality of fiber amplifiers where at least one fiber amplifier receives each phase modulated split seed beam and amplifies the phase modulated split seed beam.

6. The optical system according to claim 5 further comprising collimating optics receiving and collimating the amplified beams and directing the collimated beams to the first diffraction grating.

7. The optical system according to claim 1 wherein the first and second diffraction gratings are reflective or transmissive gratings.

8. An optical system comprising:
   a plurality of optical sources each generating a beam where all of the beams are coherent;
   a first diffraction grating receiving and diffracting the coherent beams and directing the beams;
   a second diffraction grating receiving the diffracted beams from the first diffraction grating and redirecting the diffracted beams, wherein the coherent and diffracted beams from the second diffraction grating propagate in different angular directions; and
   a diffractive optical element (DOE) receiving the diffracted beams from the second diffraction grating and generating a combined beam, wherein the DOE combines the diffracted beams into the combined beam so that the beams propagate in substantially a same direction, but where the beams have an angular dispersion caused by the DOE depending on where the beams impact the DOE, and wherein the first and second diffraction gratings remove the angular dispersion of the combined beam caused by the DOE.

9. The optical system according to claim 8 wherein the system is a fiber amplifier system.

10. The optical system according to claim 9 wherein the plurality of optical sources are fiber amplifiers.

11. The optical system according to claim 9 wherein the plurality of optical sources include at least one seed beam source providing an optical seed beam and a beam splitter splitting the seed beam into a plurality of split seed beams.

12. The optical system according to claim 11 wherein the plurality of optical sources include a plurality of phase modulators each receiving one of the split seed beams and phase modulating the split seed beam and a plurality of fiber amplifiers where at least one fiber amplifier receives each phase modulated split seed beam and amplifies the phase modulated split seed beam.

13. The optical system according to claim 12 further comprising collimating optics receiving and collimating the amplified beams and directing the collimated beams to the first diffraction grating.

14. An optical system comprising:
 a plurality of optical sources each generating a beam where all of the beams are coherent;
 a diffraction grating receiving and diffracting the coherent beams and directing the beams; and
 a diffractive optical element (DOE) receiving the diffracted beams from the diffraction grating and directing the diffracted beams in a direction so that the diffracted beams pass through the diffraction grating again, wherein the DOE combines the diffracted beams into a combined beam so that the beams propagate in substantially a same direction, but where the beams have an angular dispersion caused by the DOE depending on where the beams impact the DOE, and wherein the diffraction grating removes the angular dispersion of the beams caused by the DOE.

15. The optical system according to claim 14 wherein the system is a fiber amplifier system.

16. The optical system according to claim 15 wherein the plurality of optical sources are fiber amplifiers.

17. The optical system according to claim 15 wherein the plurality of optical sources include at least one seed beam source providing an optical seed beam and a beam splitter splitting the seed beam into a plurality of split seed beams.

18. The optical system according to claim 17 wherein the plurality of optical sources include a plurality of phase modulators each receiving one of the split seed beams and phase modulating the split seed beam and a plurality of fiber amplifiers where at least one fiber amplifier receives each phase modulated split seed beam and amplifies the phase modulated split seed beam.

19. The optical system according to claim 18 further comprising collimating optics receiving and collimating the amplified beams and directing the collimated beams to the diffraction grating.

20. The optical system according to claim 14 wherein the diffraction grating is a reflective or transmissive grating.

* * * * *